(12) United States Patent
Marchand et al.

(10) Patent No.: US 8,525,230 B2
(45) Date of Patent: Sep. 3, 2013

(54) FIELD-EFFECT TRANSISTOR WITH COMPOSITIONALLY GRADED NITRIDE LAYER ON A SILICAON SUBSTRATE

(75) Inventors: Hugues Marchand, Somerville, MA (US); Brendan J. Moran, San Jose, CA (US); Umesh K. Mishra, Montecito, CA (US); James S. Speck, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 96 days.

(21) Appl. No.: 12/901,988

(22) Filed: Oct. 11, 2010

(65) Prior Publication Data

US 2011/0108886 A1    May 12, 2011

Related U.S. Application Data

(63) Continuation of application No. 12/471,134, filed on May 22, 2009, now Pat. No. 7,816,764, which is a continuation of application No. 09/922,122, filed on Aug. 3, 2001, now Pat. No. 7,687,888.

(60) Provisional application No. 60/222,837, filed on Aug. 4, 2000.

(51) Int. Cl.
  *H01L 29/737*    (2006.01)

(52) U.S. Cl.
  USPC .......................................... 257/194

(58) Field of Classification Search
  None
  See application file for complete search history.

(56) References Cited

U.S. PATENT DOCUMENTS

| | | | |
|---|---|---|---|
| 3,893,876 A | 7/1975 | Akai et al. | |
| 4,452,646 A * | 6/1984 | Zuleeg | 438/194 |
| 5,192,987 A | 3/1993 | Khan et al. | |
| 5,239,188 A | 8/1993 | Takeuchi et al. | |
| 5,290,393 A | 3/1994 | Nakamura | |
| 5,296,395 A | 3/1994 | Khan et al. | |
| 5,389,571 A | 2/1995 | Takeuchi et al. | |
| 5,393,993 A | 2/1995 | Edmond et al. | |
| 5,442,205 A | 8/1995 | Brasen et al. | |
| 5,523,589 A | 6/1996 | Edmond et al. | |
| 5,633,192 A | 5/1997 | Moustakas et al. | |
| 5,679,965 A | 10/1997 | Schetzina | |
| 5,741,724 A | 4/1998 | Ramdani et al. | |
| 5,760,426 A | 6/1998 | Marx et al. | |
| 5,786,606 A | 7/1998 | Nishio et al. | |
| 5,815,520 A | 9/1998 | Furushima | |
| 5,821,555 A | 10/1998 | Saito et al. | |
| 5,838,029 A | 11/1998 | Shakuda | |
| 5,838,706 A | 11/1998 | Edmond et al. | |

(Continued)

FOREIGN PATENT DOCUMENTS

| | | |
|---|---|---|
| EP | 0514018 | 11/1992 |
| EP | 0852416 | 7/1998 |

(Continued)

OTHER PUBLICATIONS

EP Office Action dated Oct. 20, 2010 (EP Application No. 01957415.1).

(Continued)

*Primary Examiner* — Walter H Swanson
(74) *Attorney, Agent, or Firm* — Gates & Cooper LLP (57) ABSTRACT

A field effect transistor including a compositionally graded group-III nitride layer on a silicon substrate.

15 Claims, 10 Drawing Sheets

(56) References Cited

U.S. PATENT DOCUMENTS

| | | | |
|---|---|---|---|
| 5,866,925 A * | 2/1999 | Zolper et al. | 257/279 |
| 5,874,747 A | 2/1999 | Redwing et al. | |
| 5,880,485 A | 3/1999 | Marx et al. | |
| 5,880,491 A | 3/1999 | Soref et al. | |
| 5,923,950 A | 7/1999 | Ishibashi et al. | |
| 5,928,421 A | 7/1999 | Yuri et al. | |
| 6,039,803 A | 3/2000 | Fitzgerald et al. | |
| 6,045,626 A | 4/2000 | Yano et al. | |
| 6,046,464 A | 4/2000 | Schetzina | |
| 6,051,849 A | 4/2000 | Davis et al. | |
| 6,060,331 A | 5/2000 | Shakouri et al. | |
| 6,064,078 A | 5/2000 | Northrup et al. | |
| 6,069,021 A | 5/2000 | Terashima et al. | |
| 6,100,545 A | 8/2000 | Chiyo et al. | |
| 6,120,600 A | 9/2000 | Edmond et al. | |
| 6,121,121 A | 9/2000 | Koide | |
| 6,139,628 A | 10/2000 | Yuri et al. | |
| 6,146,457 A | 11/2000 | Solomon | |
| 6,153,010 A | 11/2000 | Kiyoku et al. | |
| 6,177,688 B1 | 1/2001 | Linthicum et al. | |
| 6,180,270 B1 | 1/2001 | Cole et al. | |
| 6,201,262 B1 | 3/2001 | Edmond et al. | |
| 6,255,198 B1 | 7/2001 | Linthicum et al. | |
| 6,261,929 B1 | 7/2001 | Gehrke et al. | |
| 6,261,931 B1 | 7/2001 | Keller et al. | |
| 6,265,289 B1 | 7/2001 | Zheleva et al. | |
| 6,291,319 B1 | 9/2001 | Yu et al. | |
| 6,328,796 B1 | 12/2001 | Kub et al. | |
| 6,329,063 B2 | 12/2001 | Lo et al. | |
| 6,358,770 B2 | 3/2002 | Itoh et al. | |
| 6,380,108 B1 | 4/2002 | Linthicum et al. | |
| 6,391,748 B1 | 5/2002 | Temkin et al. | |
| 6,403,451 B1 | 6/2002 | Linthicum et al. | |
| 6,420,197 B1 | 7/2002 | Ishida et al. | |
| 6,440,823 B1 | 8/2002 | Vaudo et al. | |
| 6,459,712 B2 | 10/2002 | Tanaka et al. | |
| 6,524,932 B1 | 2/2003 | Zhang et al. | |
| 6,548,333 B2 | 4/2003 | Smith | |
| 6,610,144 B2 | 8/2003 | Mishra et al. | |
| 6,617,060 B2 | 9/2003 | Weeks, Jr. | |
| 6,649,287 B2 | 11/2003 | Weeks, Jr. | |
| 6,707,074 B2 | 3/2004 | Yoshii et al. | |
| 6,765,240 B2 | 7/2004 | Tischler et al. | |
| 2001/0008656 A1 | 7/2001 | Tischler et al. | |
| 2001/0042503 A1 | 11/2001 | Lo et al. | |
| 2002/0020341 A1 | 2/2002 | Marchand et al. | |
| 2002/0028314 A1 | 3/2002 | Tischler et al. | |
| 2002/0074552 A1 | 6/2002 | Weeks, Jr. et al. | |
| 2002/0117681 A1 | 8/2002 | Weeks et al. | |
| 2002/0117695 A1 | 8/2002 | Borges et al. | |
| 2002/0187356 A1 | 12/2002 | Weeks, Jr. et al. | |
| 2005/0054132 A1 | 3/2005 | Nagahama et al. | |

FOREIGN PATENT DOCUMENTS

| | | |
|---|---|---|
| EP | 0942459 | 9/1999 |
| EP | 0951055 | 10/1999 |
| EP | 1022825 | 7/2000 |
| JP | 09-083016 | 3/1997 |
| JP | 11-054794 | 2/1999 |
| WO | WO 96/41906 | 12/1996 |
| WO | WO 00/33365 | 6/2000 |
| WO | 00/48239 | 8/2000 |
| WO | WO 01/27980 | 4/2001 |
| WO | WO 01/37327 | 5/2001 |
| WO | WO 01/43174 | 6/2001 |
| WO | WO 01/47002 | 6/2001 |
| WO | WO 01/59819 | 8/2001 |

OTHER PUBLICATIONS

European Search Report EP 10013685, dated Dec. 20, 2010.

Chumbes, E. et al., "Microwave performance of AlGaN/GaN high electron mobility transistors on Si(111) substrates," International Electron Devices Meeting 1999, Dec. 5, 1999-Dec. 8, 1999, pp. 397-400.

Liaw, H. et al., "Crystallinity and microstructures of aluminum nitride films deposited on Si(111) substrates," Solid-State Electronics 44 (2000) 747-755.

Schremer, A. et al., "High electronic mobility AlGaN/GaN heterostructures on (111)Si," Applied Physics Letters, vol. 76, No. 6, Feb. 7, 2000, pp. 736-738.

Bykhovski, A.D. et al., "Elastic strain relaxation in GaN-AlN-GaN semiconductor—insulator—semiconductor structures, "J. Appl. Phys. 78(6):3691-3696, Sep. 15, 1995.

Chichibu, S., et al., Appl. Phys. Left. 70(16), 2085-2087 (1997): Optical properties of tensile-strained wurtzite GaN epitaxial layers.

Chu, T. L. et al., J. Electrochem. Soc. 118, 1200 (1971): Gallium nitride films.

Dadgar, A. et al., "Metalorganic Chemical Vapor Phase Epitaxy of Crack-Free GaN on Si (111) Exceeding 1 µm in Thickness," Jpn. J. Appl. Phy. 39:L1183-1185, Nov. 15, 2000.

Edwards, N. V., et al., Appl. Phys. Lett. 73, 2808 (1998): Trends in residual stress for GaN/AlN/6H-SiC heterostructures.

Guha, S. et al., "Ultraviolet and violet GaN light emitting diodes on silicon," Appl. Phy. Lett. 72(4):415-417, Jan. 26, 1998.

Haffouz, S. et al., "The effect of the Si/N treatment of a nitridated sapphire surface on the growth mode of GaN in low-pressure metalorganic vapor phase epitaxy," Applied Physics Letters, 73(9):1278-1280, Aug. 31, 1998.

Hirosawa et al., "Growth of Single Crystal $Al_xGa_{1-x}N$ Films on Si Substrates by Metalorganic Vapor Phase Epitaxy," Jpn. J. Appl. Phys. vol. 32 (1993) pp. 1039-1042.

Lahreche, H. et al., "Optimisation of AlN and GaN growth by metalorganic vapour-phase epitaxy (MOVPE) on Si(111)," Journal of Crystal Growth, 217:13-25, 2000.

Lei, T. et al., "Epitaxial growth of zinc blende and wurtzitic gallium nitride thin films on (001) silicon," Appl. Phy. Lett. 59(8):944-946, Aug. 19, 1991.

Nikishin, S.A. et al., "High quality GaN grown on Si(111) by gas source molecular beam epitaxy with ammonia," Applied Physics Letters, 75(14):2073-2075, Oct. 4, 1999.

Nikitina, I.P., et al., Diamond and relatred materials 6, 1524 (1997): Residual strains in GaN grown on 6H-SiC.

Ohtani, A. et al., "Microstructure and photoluminescence of GaN grown on Si(111) by plasma-assisted molecular beam epitaxy," Appl. Phys. Lett. 65(1):61-63, Jul. 4, 1994.

Osinsky, A. et al., "Visible-blind GaN Schottky barrier detectors grown on Si(111)," Applied Physics Letters, 72(5):551-553, Feb. 2, 1998.

Pearsall, Thomas P., Volume Editor, "Strained-Layer Superlattices: Materials Science & Technology," Semiconductors and Semimetals, vol. 33, pp. 242-243, Department of Electrical Engineering, University of Washington, Seattle, Washington, Academic Press, Inc. 1991.

Semond, F. et al., "GaN grown on Si(111) substrate: From two-dimensional growth to quantum well assessment," Applied Physics Letters, 75(1):82-84, Jul. 5, 1999.

Seon, M. et al., "Selective growth of high quality GaN on Si(111) substrates," Applied Physics Letters, 76(14):1842-1844, Apr. 3, 2000.

Takeuchi, T., et al., J. Cryst. Growth, Dec. 1991, vol. 115, (No. 1-4): 634-8.

Tanaka, S. et al., "Defect structure in selective area growth GaN pyramid on (111)Si substrate," Applied Physics Letters, 76(19):2701-2703, May 8, 2000.

Tran, C.A. et al., "Growth of InGaN/GaN multiple-quantum-well blue light-emitting diodes on silicon by metalorganic vapor phase epitaxy," Applied Physics Letters, 751(11):1494-1496, Sep. 13, 1999.

Watanabe, A., et al., J Cryst. Growth 128, 391-396 (1993): The growth of single crystalline GaN on a Si substrate using AlN as an intermediate layer.

Zhao, G.Y. et al., "Growth of Si delta-doped GaN by metalorganic chemical-vapor deposition," Applied Physics Letters, 77(14):2195-2197, Oct. 2, 2000.

Zhao, Z.M. et al., "Metal-semiconductor-metal GaN ultraviolet photodetectors on Si(111)," Applied Physics Letters, 77(3):444-446, Jul. 17, 2000.

JP 11040847, Toshiba Corp., Feb. 12, 1999, Abstract.
JP 11145514, Toshiba Corp., May 28, 1999, Abstract.
Japanese Office Action (Notice for Reasons for Rejection) dated Feb. 7, 2012 for application No. 2002-518510 filed on Aug. 3, 2001.
International Search Report for Application No. PCT/US01/24347 mailed Dec. 19, 2001.
International Preliminary Examination Report for Application No. PCT/US01/24347 mailed Jun. 12, 2002.

EP Office Action for Application No. 01 957 415.1-2203 mailed Jun. 22, 2005.
JP Office Action for Application No. 2002-518510 mailed Jun. 21, 2011.
EP Office Action for Application 01 957 415.1-2203 mailed May 3, 2012.

* cited by examiner

FIELD-EFFECT TRANSISTOR WITH COMPOSITIONALLY GRADED NITRIDE LAYER ON A SILICAON SUBSTRATE

CROSS-REFERENCE TO RELATED APPLICATIONS

This application is a continuation of U.S. Utility patent application Ser. No. 12/471,134, filed May 22, 2009, by Hugues Marchand and Brendan J. Moran, and entitled "METHOD OF CONTROLLING STRESS IN GALLIUM NITRIDE FILMS DEPOSITED ON SUBSTRATES," now U.S. Pat. No. 7,816,764, issued Oct. 19, 2010, which application is a continuation of U.S. Utility patent application Ser. No. 09/922,122, filed Aug. 3, 2001, by Hugues Marchand and Brendan J. Moran, and entitled "METHOD OF CONTROLLING STRESS IN GALLIUM NITRIDE FILMS DEPOSITED ON SUBSTRATES," now U.S. Pat. No. 7,687,888, issued Mar. 30, 2010, which application claims priority under 35 U.S.C. §119(e) to U.S. Provisional Patent Application Ser. No. 60/222,837, filed Aug. 4, 2000, by Hugues Marchand and Brendan J. Moran, and entitled "METHOD OF CONTROLLING STRESS IN GaN FILMS DEPOSITED ON SILICON AND SILICON CARBIDE SUBSTRATES," all of which are incorporated by reference herein.

STATEMENT REGARDING FEDERALLY SPONSORED RESEARCH OR DEVELOPMENT

This invention was made with Government support under Grant No. N00014-98-1-0401, awarded by the Office of Naval Research. The Government has certain rights in this invention.

BACKGROUND OF THE INVENTION

1. Field of the Invention

The present invention relates to nitride films, and particularly methods to reduce the formation of cracks in gallium nitride films for semiconductor devices.

2. Description of the Related Art (Note: This application references a number of different publications as indicated throughout the specification by reference numbers enclosed in brackets, e.g., [x]. A list of these different publications ordered according to these reference numbers can be found below at the end of the Detailed Description of the Preferred Embodiment. Each of these publications is incorporated by reference herein.)

The deposition of GaN films on silicon substrates is difficult because of a large thermal expansion coefficient mismatch between the two materials. Most deposition techniques involve the deposition of buffer layers or stress-relief layers with a distinct composition from that of the substrate and that of GaN; there is an abrupt composition variation between the buffer layer and the GaN layer. These techniques result in GaN films which are under tensile stress at room temperature. Tensile stress favors the formation of macroscopic cracks in the GaN, which are detrimental to devices fabricated thereon.

GaN and its alloys with InN and AlN are used in visible or UV light-emitting devices (e.g. blue laser diodes) as well as high-power, high-frequency electronic devices (e.g. field-effect transistors). Because of the lack of GaN substrates, such devices are typically fabricated from a thin layer of GaN deposited on a substrate such as sapphire ($Al_2O_3$) or silicon carbide (SiC). Although both substrates are available in single-crystal form, their lattice constant is different than that of GaN. This lattice mismatch causes extended defects such as dislocations and stacking faults to be generated at the interface between the substrate and the GaN layer as well as into the GaN layer itself. The use of buffer layers such as AlN or low-temperature GaN and the optimization of deposition conditions typically yields films with approximately $10^9$ threading dislocations per square centimeter. More novel techniques such as lateral epitaxial overgrowth (LEO), "pendeoepitaxy," and maskless LEO result in lower dislocation densities (as low as $10^6$ cm$^{-2}$).

Although GaN-based devices are currently being mass-produced using both sapphire and silicon carbide substrates, the use of silicon substrates is expected to bring about further cost reductions as well as improvement to the capability of those devices. For example, silicon can be etched using simple chemicals, which allows simple substrate-removal techniques to be utilized with GaN-based films or devices. Silicon is also the material on which most of the electronic devices (e.g. microprocessors) have been developed; integrating GaN-based devices with silicon-based electronic functions would create new types of systems. Silicon is readily available in large wafer sizes with excellent crystal quality at low cost, such that devices grown on silicon may be less expensive than equivalent devices grown on sapphire or silicon carbide. Finally, silicon is a better thermal conductor than sapphire.

The growth of GaN on silicon substrates presents similar challenges as on sapphire and silicon carbide. The lattice mismatch between the (001) plane of GaN and the (111) plane of silicon is 17.6%, compared to 16% for sapphire and 3.5% for silicon carbide. The use of a thin AlN buffer has yielded GaN films on Si(111) with as low as $3\times10^9$ threading dislocations per square centimeter. However, the thermal expansion mismatch of GaN with silicon is +31%, compared to −26% for sapphire and +17% for silicon carbide. (The positive sign indicates a thermal expansion coefficient larger for GaN than for the substrate.) Assuming for the sake of demonstration that the GaN film is stress-free at the growth temperature (typically 1000 degrees centigrade), a positive thermal expansion mismatch would result in a GaN film under tensile stress after cool-down to room temperature. GaN films exhibit cracking when the tensile stress exceeds approximately 400 MPa. Cracks generally render devices inoperable due to electrical shorts or open circuits. In general the stress associated with the lattice mismatch, including any relaxation effect that may occur during growth, is referred to as "grown-in stress". The stress arising from the thermal expansion mismatch when the film is cooled from the growth temperature to room temperature is referred to as "thermal stress". The sum of the grown-in stress and thermal stress is the net stress in the film.

Several methods of forming GaN films on silicon substrates have been suggested. Takeuchi et al. [1] propose a buffer layer composed of at least aluminum and nitrogen, followed by a $(Ga_xAl_{1-x})_{1-y}In_yN$ layer. Based on technical papers published by the same group (e.g. [2], [3]) the resulting films are under tensile stress, as can be assessed by photoluminescence spectroscopy measurements. The films exhibit cracking Extensive work at the University of California, Santa Barbara (UCSB) resulted in significant improvements in crystal quality using this method; however the GaN films were always found to be under tensile stress (200-1000 MPa), which usually caused cracking. Takeuchi et al. [4] also propose 3C—SiC as a buffer layer. The resulting GaN films also exhibit cracking, which is strong evidence that they are under tensile stress. Yuri et al. [5] propose an extension of this method wherein the silicon substrate is chemically etched after the deposition of a thin layer of GaN on the SiC buffer layer, such that subsequent deposition of GaN is made possible without the tensile stress problems, associated with the presence of the silicon substrate. Marx et al. [6] propose the use of GaAs as an intermediate layer. Shakuda [7] proposes a method of forming GaN-based light-emitting devices on silicon wafers on which a silicon nitride ($Si_3N_4$) layer has been deposited.

In all the aforementioned techniques, there is a finite composition step between the substrate and the buffer layer as well as between the buffer layer and the GaN layer. The difference in composition is associated with a difference in lattice constants which, in general, means that a certain amount of elastic energy is present in the layers. The elastic energy is stored in the form of compressive strain if the (unstrained) lattice constant of the top layer is larger than that of the bottom layer. The elastic energy is maximized if the top layer grows pseudomorphically on the bottom layer, that is, if the top layer adopts the in-plane lattice constant of the bottom layer. For the cases under discussion the amount of elastic energy may exceed the energy required to form defects such as islands or dislocations, which reduce the energy of the strained layer. This is especially true if the growth is interrupted, because in general growth interruptions allow a coherently strained layer to evolve into islands. In this case the elastic energy stored in the top layer is reduced compared to the pseudomorphic case.

There is a need for methods of reducing the formation of cracks in gallium nitride films for semiconductor devices. Accordingly, there is also a need for such methods to produce compressive, rather than tensile, stresses in the films. There is further a need for methods to produce such films on common substrates such as silicon. The present invention meets these needs.

SUMMARY OF THE INVENTION

Methods of controlling stress in GaN films deposited on silicon and silicon carbide substrates and the films produced therefrom are disclosed. A typical method comprises providing a substrate and depositing a graded gallium nitride layer on the substrate having a varying composition of a substantially continuous grade from an initial composition to a final composition formed from a supply of at least one precursor in a growth chamber without any interruption in the supply. A typical semiconductor film comprises a substrate and a graded gallium nitride layer deposited on the substrate having a varying composition of a substantially continuous grade from an initial composition to a final composition formed from a supply of at least one precursor in a growth chamber without any interruption in the supply.

The present invention comprises a deposition sequence that results in the formation of crack-free device-quality GaN layers on silicon substrates using metalorganic chemical vapor deposition (MOCVD). The GaN films grown using the method of the present invention are under compressive stress, which eliminates the tendency of GaN to crack. The deposition sequence consists of a continuous grade from a material A which has a high aluminum composition (e.g. AlN, $Al_{0.5}Ga_{0.5}N$) to a material B which has a low aluminum composition (e.g. GaN, $Al_{0.2}Ga_{0.8}N$) over a thickness which constitutes a significant fraction (e.g. 20-100%) of the total thickness of the film being grown. The grade can be accomplished by variety of methods, such as (i) changing the vapor pressure of precursors in the growth chamber; (ii) changing other parameters of the growth chamber such as substrate temperature; or (iii) changing the geometry of the growth chamber. Other elements (e.g. Si, In, As) can also be introduced in the growth chamber such that intermediate materials other than AlGaN are deposited, as long as the composition variations are not abrupt. Other layers can be deposited on the graded layer such that electronic devices (e.g., field-effect transistors) and optoelectronic devices (e.g., light-emitting diodes) are formed, in accordance with common practice in the field. Alternatively, additional layers of GaN or AlGaInN alloys with thickness exceeding five micrometers can also be deposited on the graded layer as a means of forming a freestanding GaN substrate. The method can also be used to control the stress in GaN films grown on silicon carbide (SiC) substrates.

BRIEF DESCRIPTION OF THE DRAWINGS

Referring now to the drawings in which like reference numbers represent corresponding parts throughout.

DETAILED DESCRIPTION OF THE PREFERRED EMBODIMENT

Figure 1:
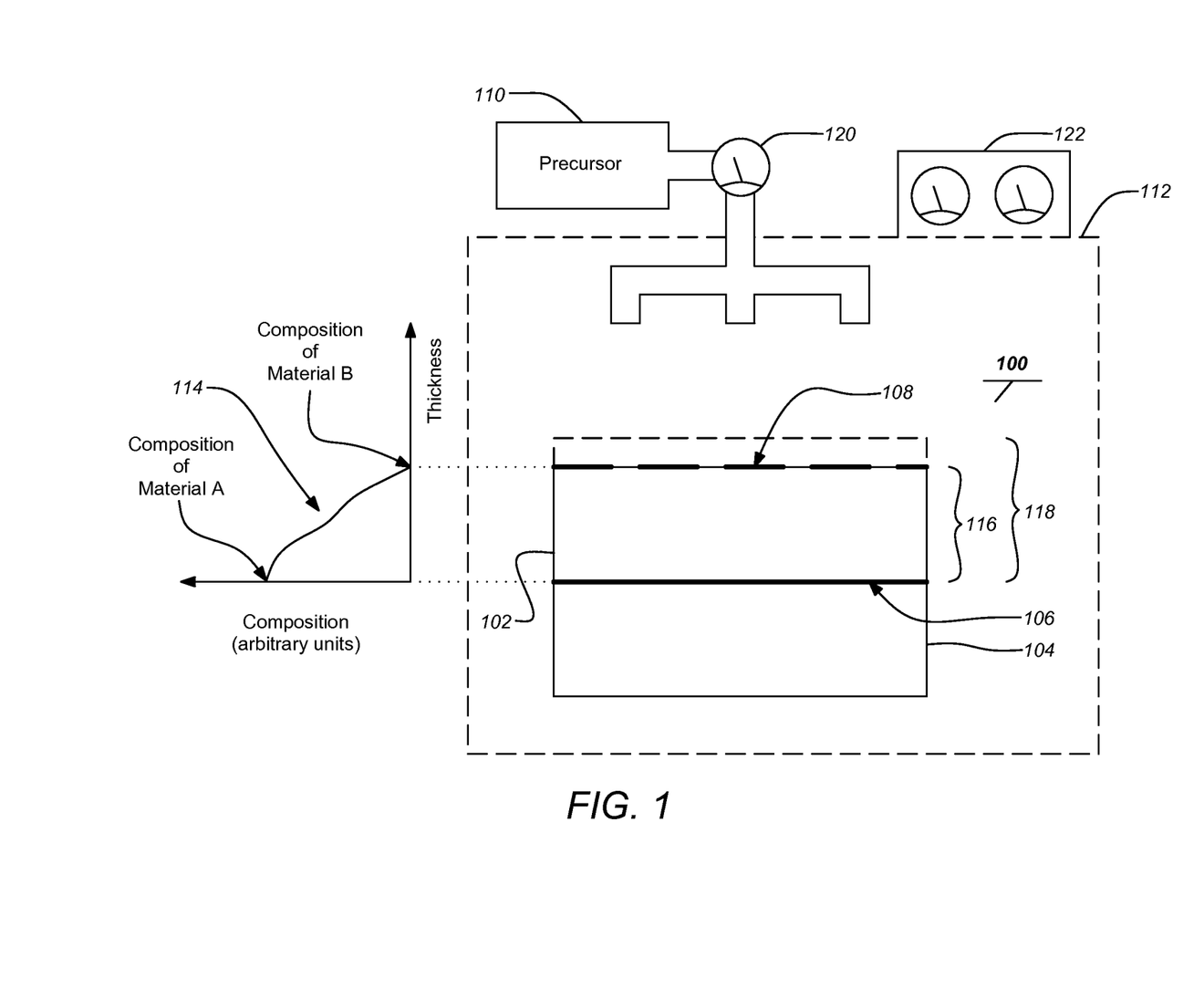
FIG. 1 is a schematic cross-sectional view illustrating the structure of the layers fabricated according to the general principles of this invention.

FIG. 1 illustrates a semiconductor film 100 of the present invention as a schematic cross-sectional view showing the structure of the layers fabricated according to the general principles of this invention. A typical method producing the film 100 comprises combining the buffer layer and the GaN layer into a single deposition step to produce a single graded gallium nitride layer 102 on a substrate 104. During the deposition the composition is varied continuously between an initial composition 106 and a final composition 108, without any interruption in the supply of precursors 110 to the growth chamber 112. The initial composition 106 is that of a material A suitable for a buffer layer which wets the substrate, for instance AlN or an AlGaN compound with a moderate to high aluminum fraction (e.g. 20% or more). The final composition 108 is that of a material B such as GaN or AlGaN with low aluminum fraction (e.g. less than 20%). The thickness 116 over which the composition grade 114 takes place is a significant fraction of the total thickness 118 being deposited, for example 20 to 80% of a one micrometer-thick film.

The principal feature of the present invention is that the composition is varied continuously between the initial composition 106 and the final composition 108 without any interruption in precursor 110 supply. From ongoing materials studies it appears that the lack of interruption in the growth process prevents the layers with low aluminum content from dissipating the elastic energy associated with the lattice mismatch between material A and material B. Thus a larger amount of compressive strain is present in the layer structure than is found when using other methods. In many cases the compressive stress is large enough to counterbalance the tensile stress induced by the cool-down procedure such that the net stress in the epitaxial layers is compressive. Compressively-strained films do not crack, hence preserving the properties of any device that may have been subsequently deposited and processed.

The grade 114 can be accomplished by a variety of methods known to those skilled in the art, such as (i) changing the vapor pressure 120 of at least one precursor 110 among Ga, Al, and N in the growth chamber 112; (ii) changing other parameters 122 of the growth chamber, e.g. total pressure, substrate temperature, total flow, rate of substrate rotation, temperature of the reactor walls; (iii) changing the geometry of the growth chamber 112, e.g., moving the substrate relative to the injectors, etc.; or (iv) introducing other elements such as Si, In, or As in the growth chamber 112 such that intermediate-materials other than AlGaN are deposited, as long as the composition variations are not abrupt. Other layers can be deposited after the GaN layer such that electronic devices (e.g. field-effect transistor) and optoelectronic devices (e.g. light-emitting diodes) are formed.

The mathematical function relating the composition of the growing films to the thickness or time can be made to assume any suitable functional form with the use of proper process controllers. The simplest case is that for which the composition varies linearly as a function of time; if the flow rates are adjusted such that the rate of deposition remains constant with time, this method would produce a composition varying linearly with thickness, unless segregation effects occur. In other cases, the rate of composition variation could be smaller (or larger) at the beginning and the end of the grade to further tailor the grown-in stress.

A typical embodiment of the grading process uses AlN as the initial composition 106 and GaN as the final composition 108. The composition can be controlled by changing the partial pressure of the gallium, aluminum, and nitrogen precursors (trimethygallium, trimethylaluminum, and ammonia, respectively). In one embodiment, the substrate 104 is Si(111) and the total thickness 118 of the deposited layer 102 is approximately one micrometer. The growth temperature was 1050 degrees centigrade.

Figure 2:
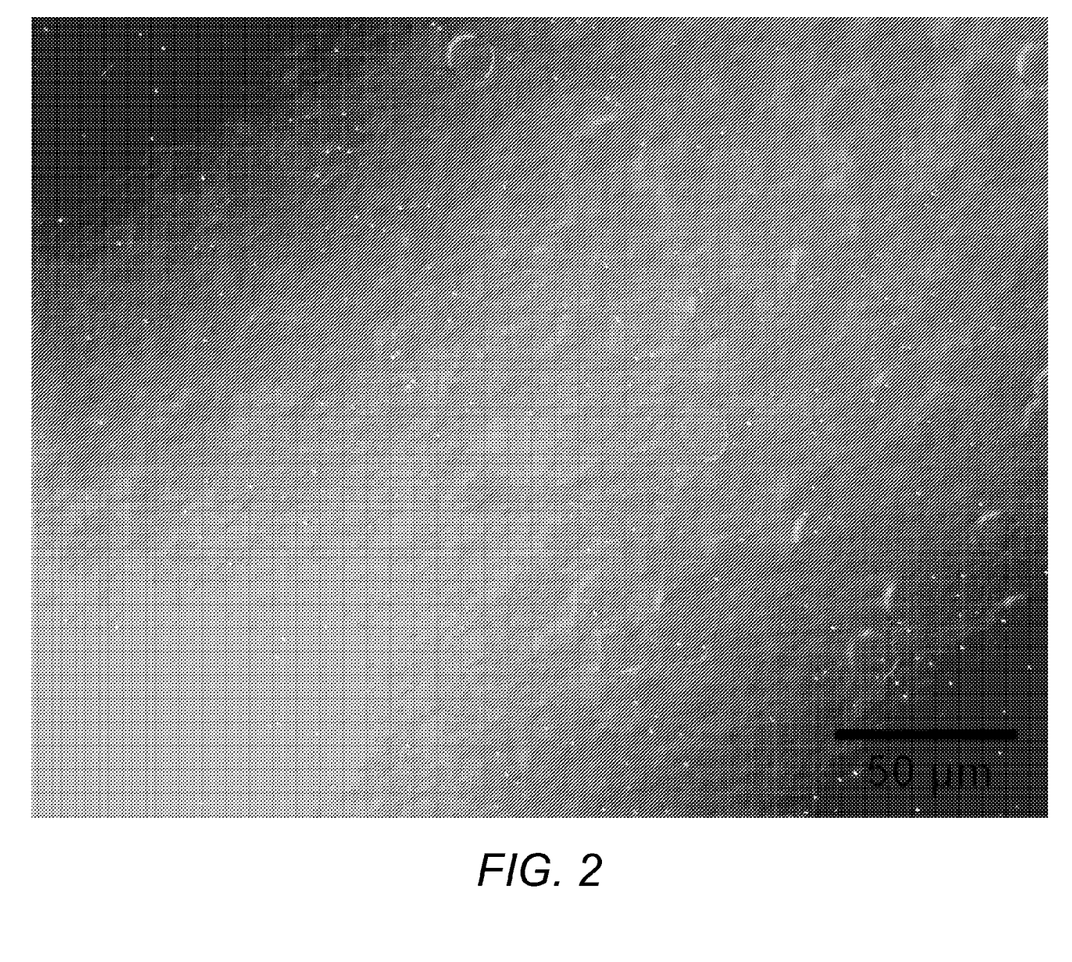
FIG. 2 is an optical micrograph showing the surface morphology of a graded layer (AlN to GaN) deposited on a Si(111) substrate according to the present invention.

FIG. 2 shows an example GaN film of the present invention. The net stress in one example was measured to be 270 MPa (compressive) using a laser deflection measurement. Optical measurements (photoluminescence, Raman) were also performed and confirmed this value. The GaN film 102 was free of cracks, as shown in FIG. 2. The microstructure of the film was of the single-crystal type.

Figure 3:
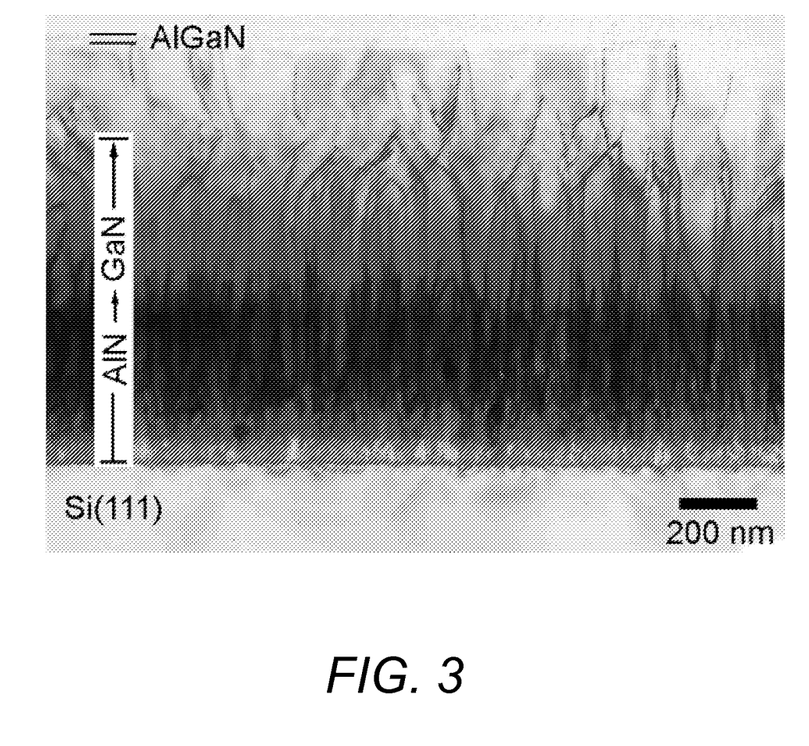
FIG. 3 is a cross-section view based on a transmission electron micrograph (TEM) illustrating the microstructure of a graded layer (AlN to GaN) deposited on a Si(111) substrate according to the present invention.

FIG. 3 is a cross-section view based on a transmission electron micrograph (TEM) illustrating the microstructure of a graded layer (AlN to GaN) deposited on a Si(111) substrate according to the present invention. The dislocation density was higher than in state-of-the-art films at the onset of growth ($>10^{11}$ cm$^{-2}$), but, because of dislocation annihilation reactions, was low enough ($10^9$-$10^{10}$ cm$^{-2}$) at the surface of the film to enable device demonstrations, and as will become apparent below.

Figure 4:
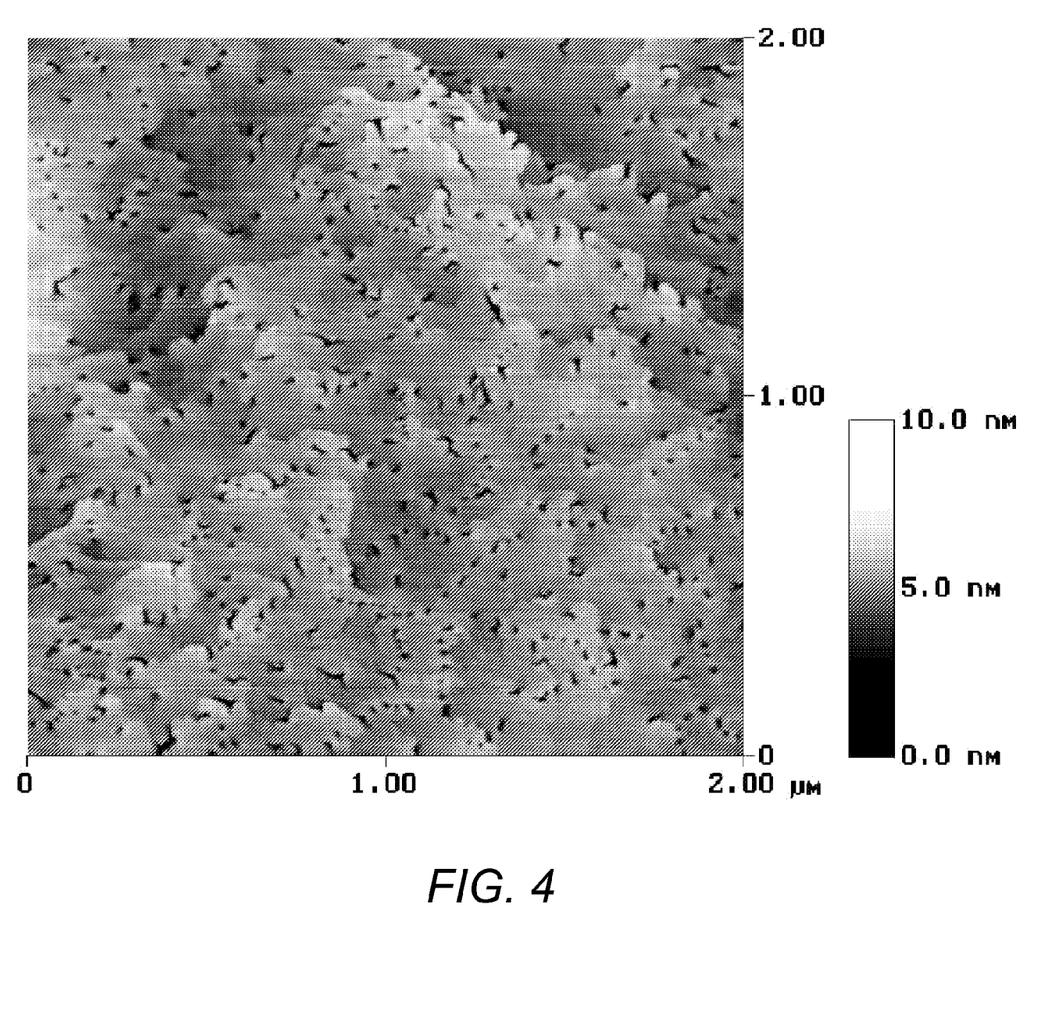
FIG. 4 is a plan-view micrograph based on an atomic force microscopy (AFM) scan illustrating the surface morphology of a graded layer (AlN to GaN) deposited on a Si(111) substrate according to the present invention.

FIG. 4 is a plan-view micrograph based on an atomic force microscopy (AFM) scan illustrating the surface morphology of a graded layer (AlN to GaN) deposited on a Si(111) substrate according to the present invention. The surface morphology was similar to that of the state of the art GaN films grown on sapphire or silicon carbide substrates as indicated by the atomic force microscopy images. When repeating the process for a thinner film (~0.55 μm) the compressive stress was measured to be 400 MPa. Several embodiments of the grading method are available using the present invention.

Figure 5:
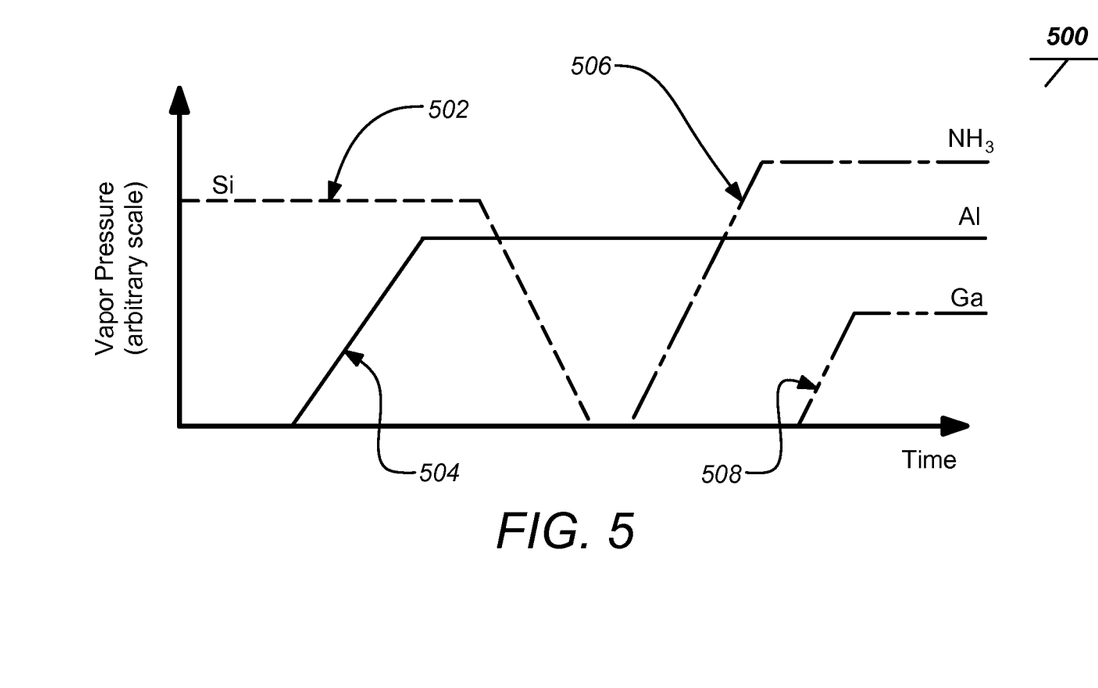
FIG. 5 is a simplified process flow diagram illustrating the sequence in which precursor chemicals are introduced in the growth chamber according to one example of the present invention.

FIG. 5 is a simplified process flow diagram 500 illustrating the sequence in which precursor 110 chemicals are introduced in the growth chamber 112 according to one embodiment of the present invention. In the example, the grading process begins with the deposition of silicon on the surface of the heated silicon wafer by use of a suitable silicon precursor, for example disilane ($Si_2H_6$) as indicated by the Si grade line 502. The grade to an aluminum-containing alloy, as indicated by the Al grade line 504, is effected by introducing a controlled amount of a suitable aluminum precursor such as trimethylaluminum (TMAl), thus forming an aluminum silicide. The silicon precursor 110 is then progressively removed from the chamber, thus forming a thin film of aluminum. A nitrogen precursor such as ammonia ($NH_3$) is progressively added so as to complete the transition to aluminum nitride (shown by the $NH_3$ grade line 506), after which the sequence continues with the introduction of a gallium precursor (e.g. trimethylgallium, TMGa) shown by the Ga grade line 508.

In another embodiment of the present invention, the initial composition 106 material consists of silicon (deposited on the substrate 104 as discussed above) and the final composition 108 material consists of GaN, but only silicon, gallium, and nitrogen precursors 110 are used such that the formation of an AlN intermediate layer is avoided. As reported by Chu et al. [8] the direct deposition of GaN on Si substrates 104 usually leads to island formation and highly-defected GaN films. However, in the present invention, the formation of islands is hampered because the deposition is not interrupted. Since the lattice mismatch between GaN and Si(111) is only slightly larger than that between AlN and Si(111), this particular deposition sequence leads to the formation of compressively-stressed GaN on Si(111).

Figure 6A:
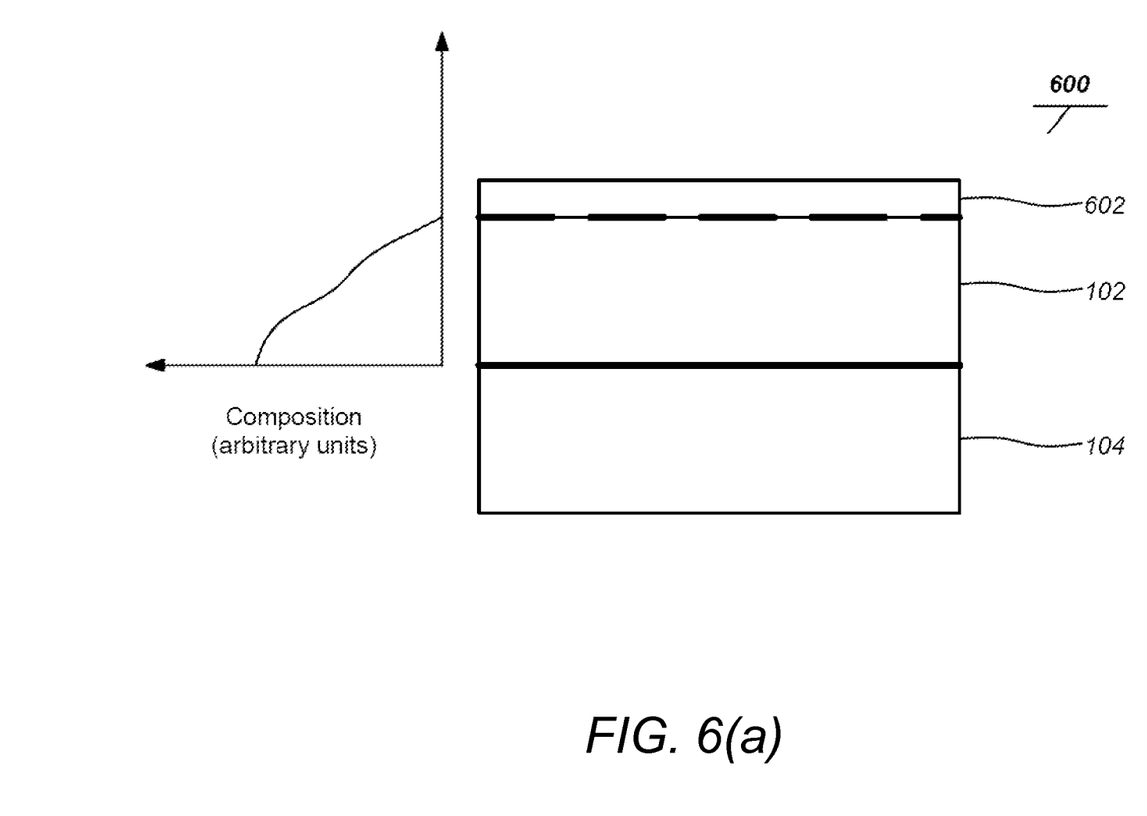
FIG. 6(a) is a schematic cross-sectional view illustrating the layers used to fabricate a field-effect transistor (FET) device according to one example of the present invention.
Figure 6B:
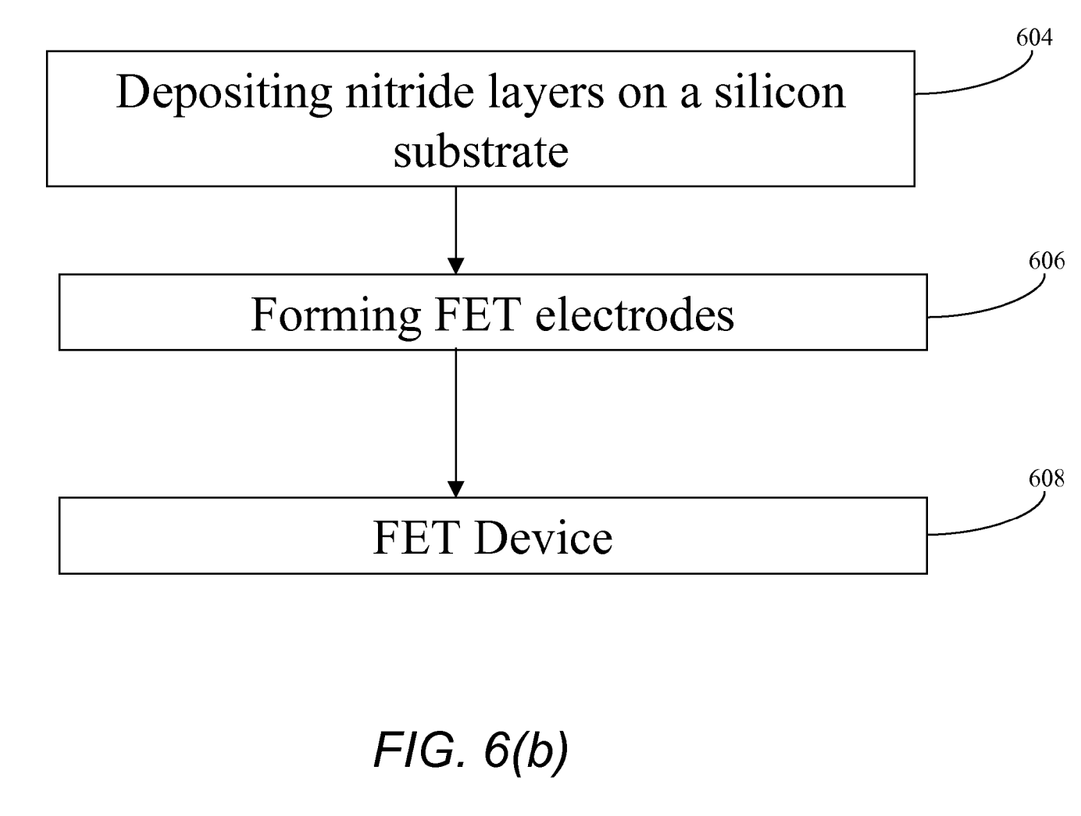
FIG. 6(b) is a flowchart illustrating a method of fabricating an FET, according to one example of the present invention.

FIG. 6 is a schematic cross-sectional view illustrating the layers used to fabricate a field-effect transistor (FET) device 600 according to one example of the present invention. Several such embodiments of the present invention exist wherein additional layers 602 are deposited following the formation of the graded layer 102 on a substrate 104 for the purpose of fabricating specific devices. The example fabrication process consists of a thin ($-0.2 < x < -0.5$) $Al_xGa_{1-x}N$ or InGaAlN layer 602 deposited on top of the graded layer 102 which ends with a composition of GaN, as illustrated in block 604 of FIG. 6(*b*). Following usual processing steps, as illustrated in block 606 of FIG. 6(*b*), such as electrode formation, FETs are produced with the present invention having characteristics comparable to state-of-the-art devices fabricated using other substrates (Block 608).

Figure 7:
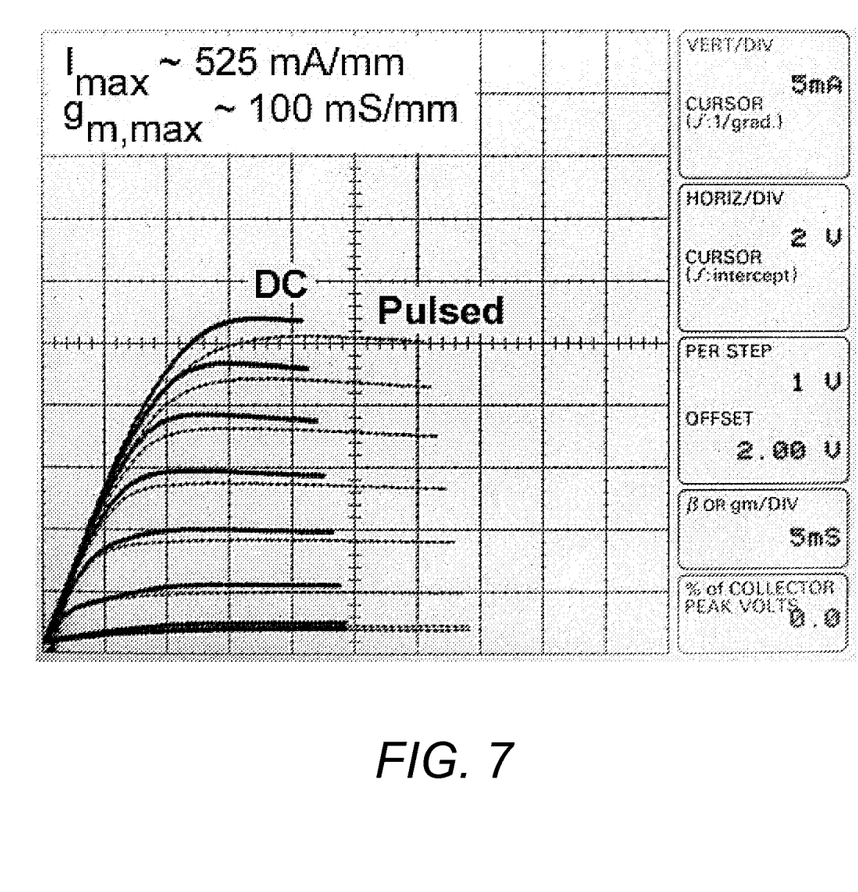
FIG. 7 is a set of characteristic curves illustrating the performance of a field-effect transistor (FET) fabricated according to one example of the present invention.

FIG. 7 is a set of characteristic curves illustrating the performance of a field-effect transistor (FET) device fabricated according to one example of the present invention. The curves represent the source-drain current as a function of source-drain voltage for increasing gate bias in common-source configuration. The saturation current per unit of gate width is 525 mA/mm and the transconductance per unit of gate width is 100 mS/mm.

In another embodiment of the invention, additional layers 602 of GaN or AlGaInN alloys with thickness exceeding five micrometers can be deposited on the graded layer 102 as a means of fabricating free-standing GaN substrates. The silicon substrate 104 can be removed either by chemical etching, mechanical polishing, or by any other means generally in use in the field.

The method can also be applied to growth on silicon carbide substrates 104. It has been demonstrated by other groups that the stress in GaN films grown on silicon carbide using a thin AlN buffer can be compressive for films thinner than approximately 0.7 μm, while films thicker than ~0.7 μm are generally under tensile stress. [9] One group has reported that films grown using 0.3 μm-thick $Al_{0.3}Ga_{0.7}N$ buffer layers were under small compressive stress (~250 MPa). [10] Using the same parameters as for the demonstration on Si(111) described above, the present method produced a 0.65 μm-thick GaN film under 950 MPa of compressive stress when grown on a 4H—SiC semi-insulating substrate. The same process applied to a 1.9 μm-thick film grown on 6H—SiC resulted in 815 MPa of compressive stress.

Figure 8:
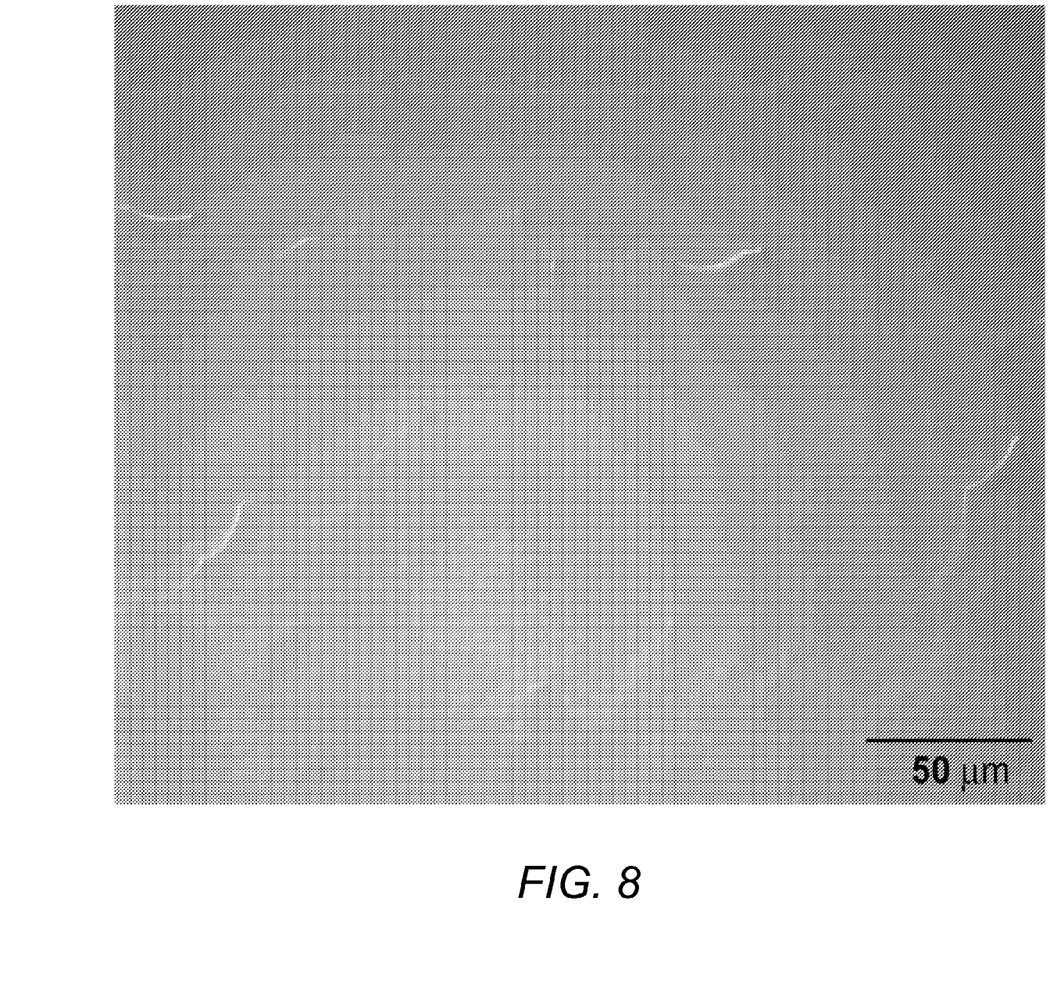
FIG. 8 is an optical micrograph showing the surface morphology of a graded layer (AlN to GaN) deposited on a 6H—SiC substrate according to the present invention.
Figure 9:
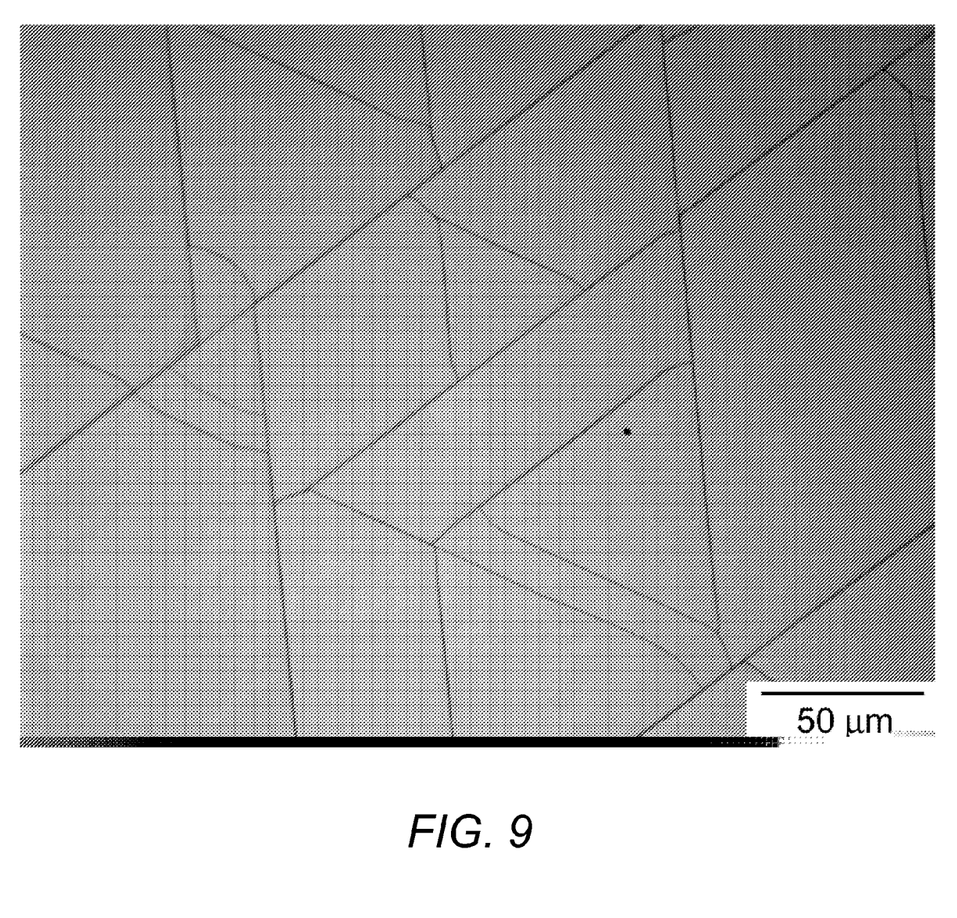
FIG. 9 is an optical micrograph showing the surface morphology of a GaN layer deposited on a 6H—SiC substrate according to a comparative example in the case where a thin AlN buffer is used instead of a thick graded layer.

FIGS. 8 and 9 are optical micrographs comparing results of the present with those of a conventional process. FIG. 8 shows the surface morphology of a graded layer 102 (AlN to GaN) deposited on a 6H—SiC substrate according to the present invention. The graded layer 102 GaN film of FIG. 8 was free of cracks and exhibited a smooth morphology. FIG. 9 is an optical micrograph showing the surface morphology of a GaN layer deposited on a 6H—SiC substrate according to a comparative example in the case where a thin AlN buffer is used instead of a thick graded layer. The stress measured for such a film grown using a thin AlN buffer or a thin grade is typically tensile, on the order of 500 MPa; cracks are present in such films, as shown.

CONCLUSION

This concludes the description including the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching.

It is intended that the scope of the invention be limited not by this detailed description, but rather by the claims appended hereto. The above specification, examples and data provide a complete description of the use of the invention. Since many embodiments of the invention can be made without departing from the spirit and scope of the invention, the invention resides in the claims hereinafter appended.

REFERENCES

The following references are all incorporated by reference herein:
1. T. Takeuchi, H. Amano, I. Akasaki, A. Watanabe, K. Manabe, U.S. Pat. No. 5,389,571: Method of fabricating a gallium nitride based semiconductor device with an aluminum and nitrogen containing intermediate layer.
2. A. Watanabe, T. Takeuchi, K. Hirosawa, H. Amano, K. Hiramatsu, and I. Akasaki, J. Cryst. Growth 128, 391-396 (1993): The growth of single crystalline GaN on a Si substrate using AlN as an intermediate layer.
3. S. Chichibu, T. Azuhata, T. Sota, H. Amano, and I. Akasaki, Appl. Phys. Lett. 70(16), 2085-2087 (1997): Optical properties of tensile-strained wurtzite GaN epitaxial layers.
4. Takeuchi, T. et al., J. Cryst. Growth, December 1991, vol. 115, (no. 1-4): 634-8.
5. M. Yuri, T. Ueda, T. Baba, U.S. Pat. No. 5,928,421: Method of forming gallium nitride crystal.
6. D. Marx, Z. Kawazu, N. Hayafuji, U.S. Pat. No. 5,760,426: Heteroepitaxial semiconductor device including silicon substrate, GaAs layer and GaN layer #13.
7. Y. Shakuda, U.S. Pat. No. 5,838,029: GaN-type light emitting device formed on a silicon substrate.
8. T. L. Chu, J. Electrochem. Soc. 118, 1200 (1971): Gallium nitride films.
9. N. V. Edwards, M. D. Bremser, R. F. Davis, A. D. Batchelor, S. D. Yoo, C. F. Karan, and D. E. Aspnes, Appl. Phys. Lett. 73, 2808 (1998): Trends in residual stress for GaN/AlN/6H—SiC heterostructures.
10. I. P. Nikitina, M. P. Sheglov, Yu. V. Melnik, K. G. Irvine, and V. A. Dimitriev, Diamond and related materials 6, 1524 (1997): Residual strains in GaN grown on 6H—SiC.

What is claimed is:
1. A field-effect transistor comprising a group-III nitride on a silicon substrate, wherein the field-effect transistor:
   (i) is capable of supporting a current per unit of gate width of the field-effect transistor that is less than about 525 mA/mm, and
   (ii) has a transconductance per unit of gate width of the field-effect transistor that is about 100 mS/mm or less.
2. The field-effect transistor of claim 1, wherein the group-III nitride is a graded group-III nitride layer.
3. The field-effect transistor of claim 2, wherein the graded group-III nitride layer is a single crystal graded group-III nitride layer.
4. The field-effect transistor of claim 1, further comprising an $Al_xGa_{1-x}N$ layer.
5. A field-effect transistor comprising a group-III nitride on a silicon substrate, wherein the field-effect transistor has a transconductance per unit of gate width of the field-effect transistor that is about 100 mS/mm or less.
6. The field-effect transistor of claim 5, wherein the group-III nitride is a graded group-III nitride layer.
7. The field-effect transistor of claim 6, wherein the graded group-III nitride layer is a single crystal graded group-III nitride layer.
8. The field-effect transistor of claim 5, further comprising an $Al_xG_{1-x}N$ layer.
9. The field-effect transistor of claim 5, wherein a saturation current of the field-effect transistor is at least 25 mA.
10. The field-effect transistor of claim 9, wherein a transconductance of the field-effect transistor is at least 5 mS.
11. The field-effect transistor of claim 9, wherein the group-III nitride is a graded group-III nitride layer.
12. The field-effect transistor of claim 9, further comprising an $Al_xGa_{1-x}N$ layer.
13. The field-effect transistor of claim 5, wherein a transconductance of the field-effect transistor is at least 5 mS.
14. The field-effect transistor of claim 13, wherein the group-III nitride is a graded group-III nitride layer.
15. The field-effect transistor of claim 13, further comprising an $Al_xGa_{1-x}N$ layer.

* * * * *